United States Patent
Chiu et al.

(10) Patent No.: US 9,455,211 B2
(45) Date of Patent: Sep. 27, 2016

(54) INTEGRATED FAN-OUT STRUCTURE WITH OPENINGS IN BUFFER LAYER

(71) Applicant: Taiwan Semiconductor Manufacturing Company, Ltd., Hsin-Chu (TW)

(72) Inventors: Wu Sen Chiu, Hsin-Chu (TW); Li-Hui Cheng, New Taipei (TW); Po-Hao Tsai, Zhongli (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/577,450

(22) Filed: Dec. 19, 2014

(65) Prior Publication Data

US 2015/0102502 A1 Apr. 16, 2015

Related U.S. Application Data

(63) Continuation-in-part of application No. 14/024,311, filed on Sep. 11, 2013.

(51) Int. Cl.
*H01L 23/31* (2006.01)
*H01L 23/48* (2006.01)
(Continued)

(52) U.S. Cl.
CPC .......... *H01L 23/315* (2013.01); *H01L 21/561* (2013.01); *H01L 21/563* (2013.01); *H01L 21/6835* (2013.01); *H01L 21/76802* (2013.01); *H01L 23/3114* (2013.01); *H01L 23/3142* (2013.01); *H01L 23/481* (2013.01); *H01L 24/19* (2013.01); *H01L 24/97* (2013.01); *H01L 25/105* (2013.01); *H01L 25/50* (2013.01); *H01L 21/6836* (2013.01); *H01L 24/73* (2013.01); *H01L 25/0657* (2013.01); *H01L 2221/68327* (2013.01); *H01L 2221/68345* (2013.01); *H01L 2221/68372* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01);
(Continued)

(58) Field of Classification Search
CPC .......... H01L 23/3114; H01L 23/3142; H01L 23/315; H01L 21/563
See application file for complete search history.

(56) References Cited

U.S. PATENT DOCUMENTS 5,255,431 A 10/1993 Burdick
5,494,862 A * 2/1996 Kato ..................... H01L 21/306
257/E21.214

(Continued)

FOREIGN PATENT DOCUMENTS

DE 102006010511 A1 9/2007
KR 101177664 B1 8/2012
KR 1020130085821 A 7/2013

*Primary Examiner* — Joseph C Nicely
(74) *Attorney, Agent, or Firm* — Slater Matsil, LLP

(57) ABSTRACT

A package includes a molding compound, a through-via penetrating through the molding compound, a device die molded in the molding compound, and a buffer layer on and contacting the molding compound. An opening is through the buffer layer to the through-via. The buffer layer has ripples in a plane parallel to an interface between the molding compound and the buffer layer and around a circumference of the opening. Other embodiments contemplate an additional package bonded to the package, and methods for forming the package.

18 Claims, 17 Drawing Sheets

(51) Int. Cl.
*H01L 21/768* (2006.01)
*H01L 25/10* (2006.01)
*H01L 21/56* (2006.01)
*H01L 23/00* (2006.01)
*H01L 25/00* (2006.01)
*H01L 21/683* (2006.01)
*H01L 25/065* (2006.01)

(52) U.S. Cl.
CPC .. *H01L2224/92244* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2225/1082* (2013.01); *H01L 2924/12042* (2013.01); *H01L 2924/15311* (2013.01); *H01L 2924/181* (2013.01)

(56) References Cited

U.S. PATENT DOCUMENTS

| | | | |
|---|---|---|---|
| 7,619,901 B2* | 11/2009 | Eichelberger | H01L 21/6835 361/763 |
| 8,133,762 B2* | 3/2012 | Pagaila | H01L 21/568 257/741 |
| 8,237,060 B2* | 8/2012 | Tanaka | H01L 23/5389 174/260 |
| 8,829,686 B2 | 9/2014 | Hong et al. | |
| 9,029,998 B2* | 5/2015 | Jang | H01L 23/34 257/686 |
| 9,048,222 B2 | 6/2015 | Hung et al. | |
| 2006/0099786 A1* | 5/2006 | Fan | H01L 21/76802 438/597 |
| 2008/0316714 A1* | 12/2008 | Eichelberger | H01L 21/6835 361/728 |
| 2009/0120680 A1* | 5/2009 | Tanno | H01L 21/4853 174/263 |
| 2009/0244865 A1* | 10/2009 | Tanaka | H01L 23/5389 361/764 |
| 2010/0316878 A1* | 12/2010 | Naritomi | B29C 45/14311 428/461 |
| 2011/0128711 A1* | 6/2011 | Yim | H01L 21/563 361/760 |
| 2011/0291218 A1* | 12/2011 | Yamamura | H01L 27/1462 257/443 |
| 2012/0074586 A1* | 3/2012 | Seo | H01L 25/16 257/774 |
| 2012/0285924 A1 | 11/2012 | Lee et al. | |
| 2013/0062760 A1* | 3/2013 | Hung | H01L 21/561 257/738 |
| 2013/0107482 A1* | 5/2013 | Inagaki | H01G 4/224 361/763 |
| 2013/0127054 A1* | 5/2013 | Muthukumar | H01L 23/3121 257/738 |
| 2013/0187813 A1* | 7/2013 | Yao | H01Q 7/00 343/700 MS |
| 2013/0299466 A1* | 11/2013 | Leu | B82Y 30/00 219/121.61 |
| 2014/0048906 A1 | 2/2014 | Shim et al. | |
| 2014/0110856 A1* | 4/2014 | Lin | H01L 24/19 257/774 |
| 2014/0190728 A1* | 7/2014 | Chou | H05K 3/002 174/252 |
| 2014/0252646 A1* | 9/2014 | Hung | H01L 23/481 257/774 |
| 2014/0299356 A1* | 10/2014 | Zhang | H05K 3/0035 174/250 |
| 2015/0069623 A1 | 3/2015 | Tsai et al. | |
| 2015/0103357 A1* | 4/2015 | Schmit | G01B 11/303 356/511 |
| 2015/0247808 A1* | 9/2015 | Van Der Wilt | G01N 21/9501 356/237.5 |

* cited by examiner

INTEGRATED FAN-OUT STRUCTURE WITH OPENINGS IN BUFFER LAYER

This application is a continuation-in-part of U.S. patent application Ser. No. 14/024,311, filed on Sep. 11, 2013, entitled "Integrated Fan-Out Structure with Guiding Trenches in Buffer Layer," which application is hereby incorporated herein by reference in its entirety.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An Integrated Fan-Out (InFO) package including through-vias and the methods of forming the same are provided in accordance with various exemplary embodiments. The intermediate stages of forming the InFO package are illustrated. The variations of the embodiments are discussed. Throughout the various views and illustrative embodiments, like reference numbers are used to designate like elements.

Figure 1:
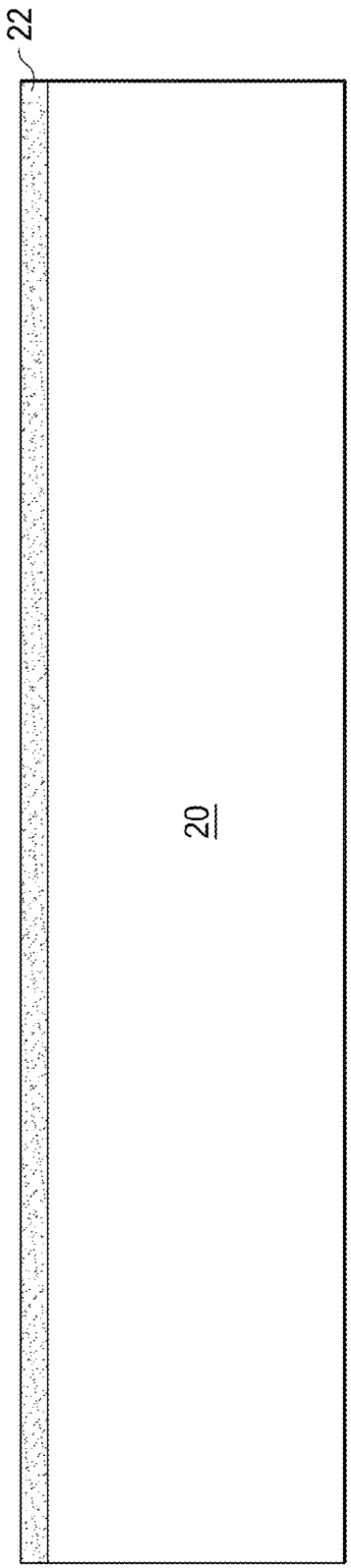
FIGS. 1 through 12 and 13A are cross-sectional views of intermediate stages in the manufacturing of a Through Integrated fan-out Via (TIV) package in accordance with some exemplary embodiments.

FIGS. 1 through 12, 13A, 14A, 15, and 16 are cross-sectional views of intermediate stages in the manufacturing of a package structure in accordance with some exemplary embodiments. Referring to FIG. 1, carrier 20 is provided, and adhesive layer 22 is disposed on carrier 20. Carrier 20 may be a blank glass carrier, a blank ceramic carrier, or the like. Adhesive layer 22 may be formed of an adhesive such as a Ultra-Violet (UV) glue, Light-to-Heat Conversion (LTHC) glue, or the like, although other types of adhesives may be used.

Figure 2:
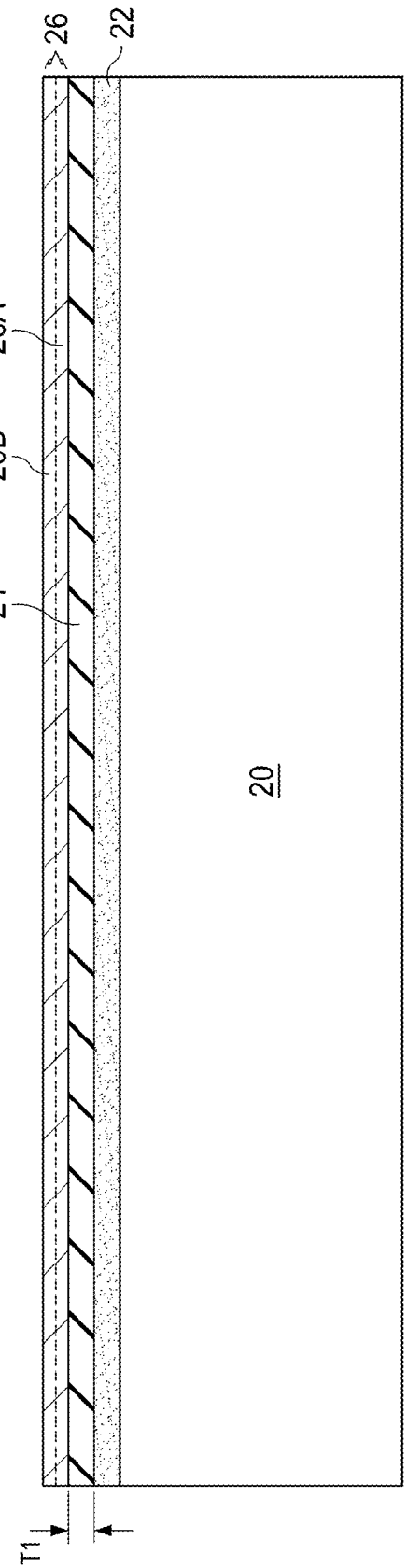

Referring to FIG. 2, buffer layer 24 is formed over adhesive layer 22. Buffer layer 24 is a dielectric layer, which may be a polymer layer comprising a polymer. The polymer may be, for example, polyimide, PolyBenzOxazole (PBO), BenzoCycloButene (BCB), Ajinomoto Buildup Film (ABF), Solder Resist film (SR), or the like. Buffer layer 24 is a planar layer having a uniform thickness, wherein the thickness T1 may be greater than about 2 µm, and may be between about 2 µm and about 40 µm. The top and the bottom surfaces of buffer layer 24 are also planar.

Seed layer 26 is formed on buffer layer 24, for example, through Physical Vapor Deposition (PVD) or metal foil laminating. Seed layer 26 may comprise copper, copper alloy, aluminum, titanium, titanium alloy, or combinations thereof. In some embodiments, seed layer 26 comprises titanium layer 26A and copper layer 26B over titanium layer 26A. In alternative embodiments, seed layer 26 is a copper layer.

Figure 3:
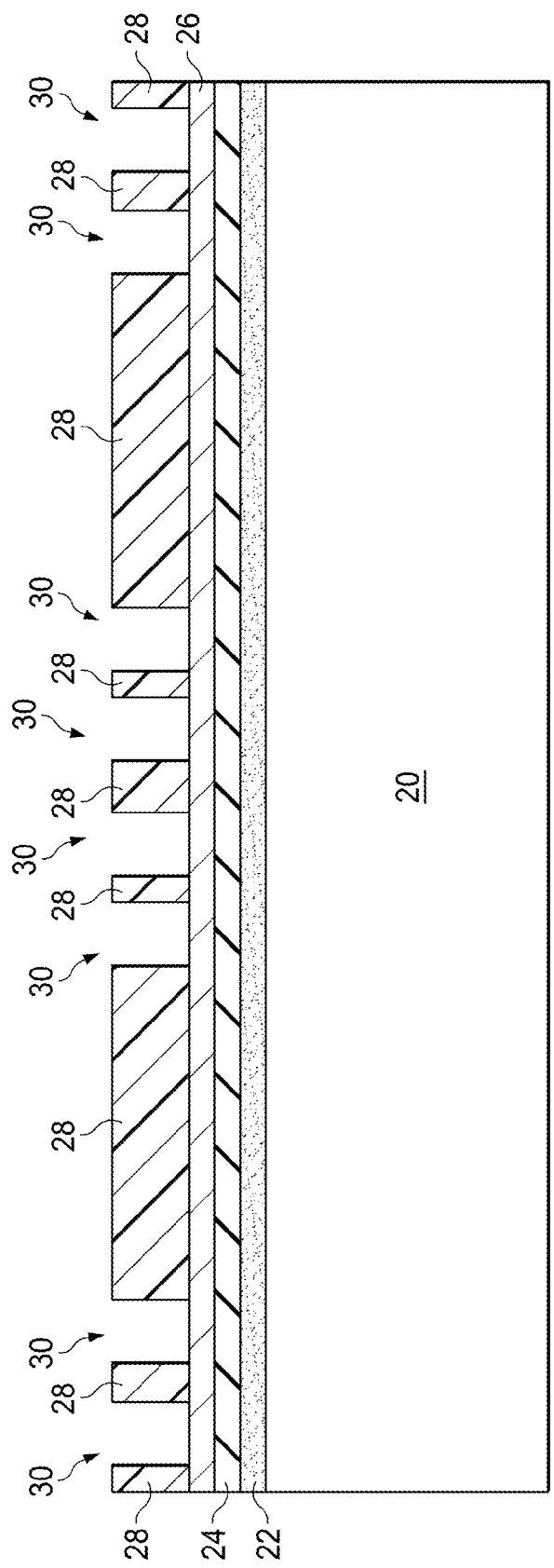

Referring to FIG. 3, photo resist 28 is applied over seed layer 26, and is then patterned. As a result, openings 30 are formed in photo resist 28, through which some portions of seed layer 26 are exposed.

Figure 4:
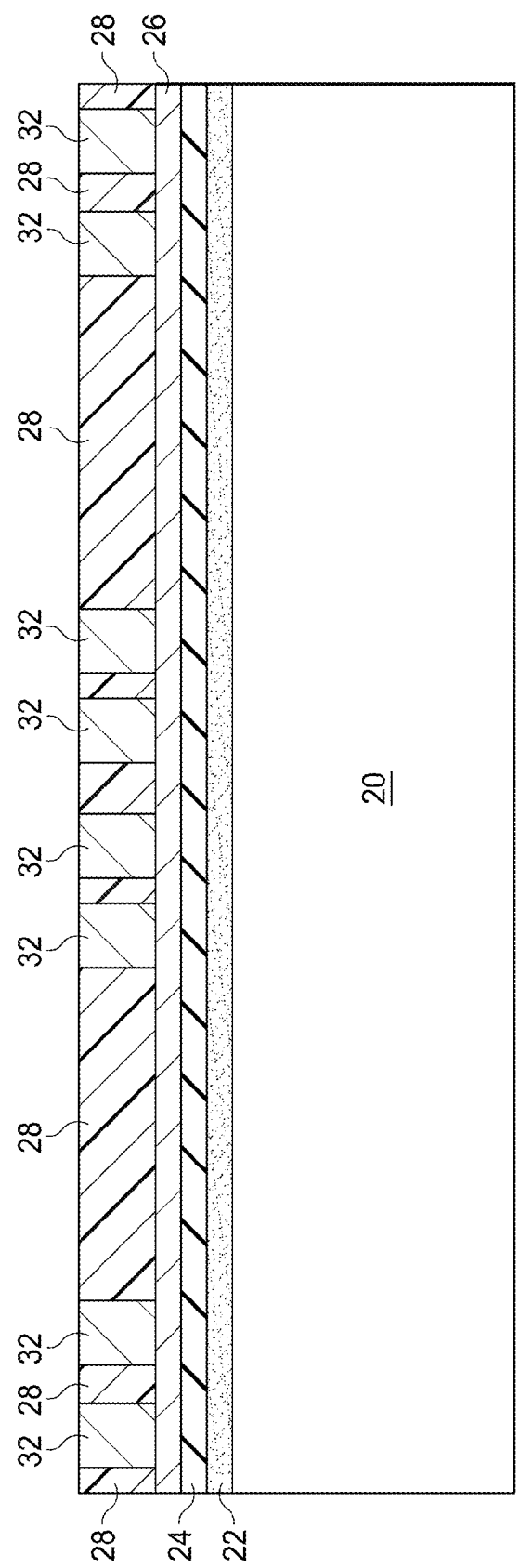
Figure 5:
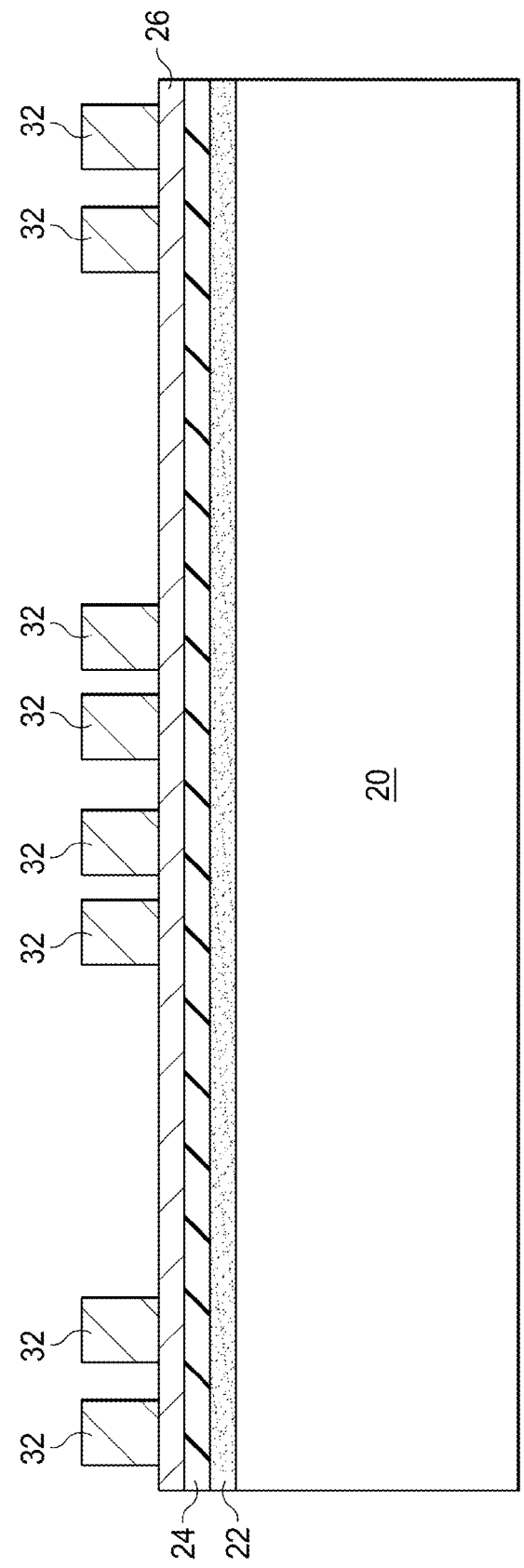

As shown in FIG. 4, metal features 32 are formed in photo resist 28 through plating, which may be electro plating or electro-less plating. Metal features 32 are plated on the exposed portions of seed layer 26. Metal features 32 may comprise copper, aluminum, tungsten, nickel, solder, or alloys thereof. The top-view shapes of metal features 32 may be rectangles, squares, circles, or the like. The heights of metal features 32 are determined by the thickness of the subsequently placed dies 34 (FIG. 7), with the heights of metal features 32 greater than the thickness of dies 34 in some embodiments. After the plating of metal features 32, photo resist 28 is removed, and the resulting structure is shown in FIG. 5. After photo resist 28 is removed, the portions of seed layer 26 that are covered by photo resist 28 are exposed.

Figure 6:
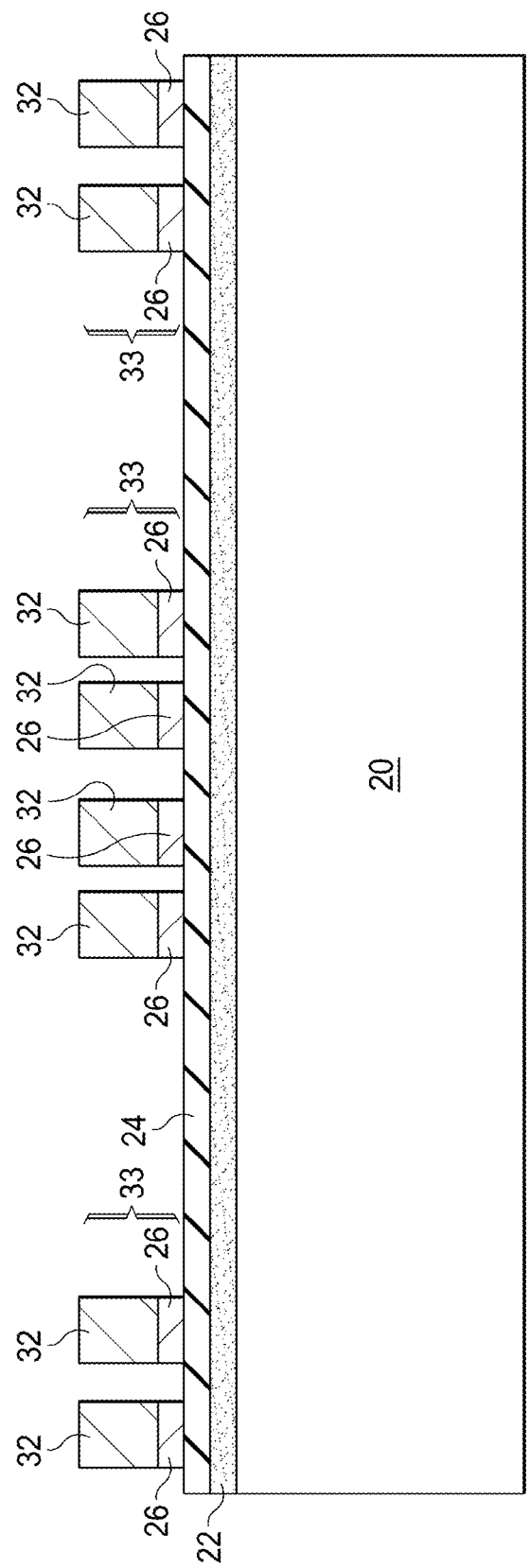

Referring to FIG. 6, an etch step is performed to remove the exposed portions of seed layer 26, wherein the etching may be an anisotropic etching. The portions of seed layer 26 that are overlapped by metal features 32, on the other hand, remain not etched. Throughout the description, metal features 32 and the remaining underlying portions of seed layer 26 are in combination referred to as Through InFO Vias (TIVs) 33, which are also referred to as through-vias 33. Although seed layer 26 is shown as a layer separate from metal features 32, when seed layer 26 is formed of a material similar to or the same as the respective overlying metal features 32, seed layer 26 may be merged with metal features 32 with no distinguishable interface therebetween. In alternative embodiments, there exist distinguishable interfaces between seed layer 26 and the overlying metal features 32.

Figure 7:
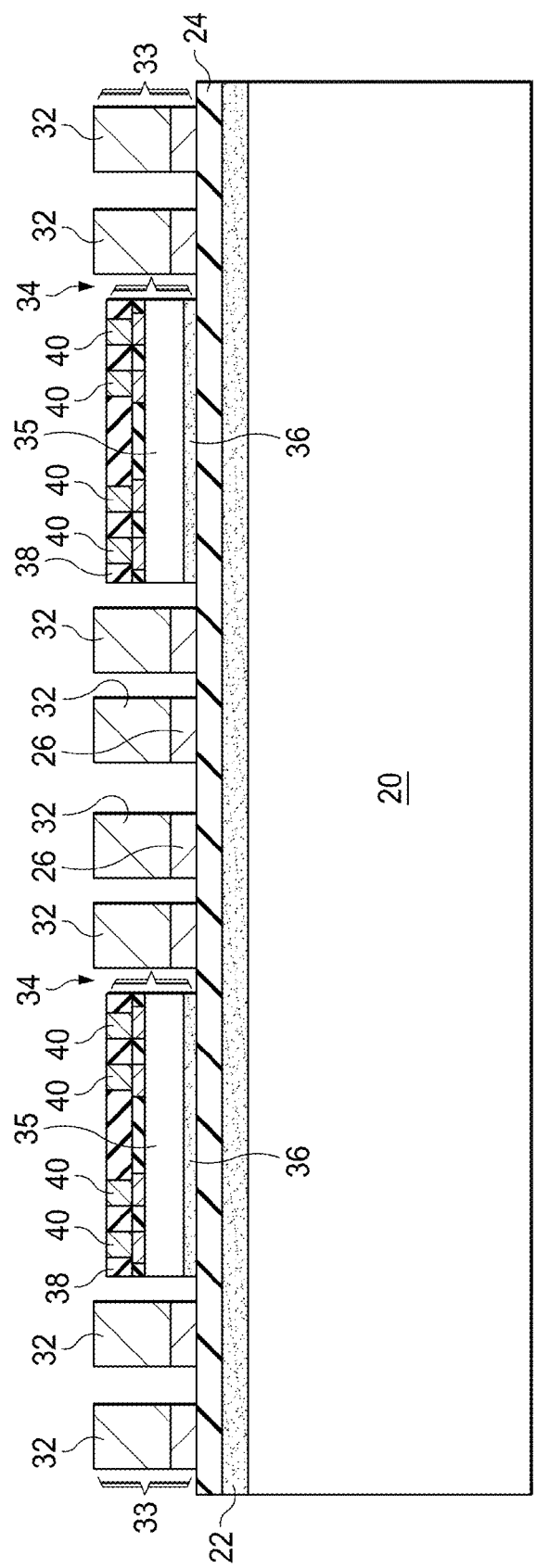

FIG. 7 illustrates the placement of device dies 34 over buffer layer 24. Device dies 34 may be adhered to buffer layer 24 through adhesive layer(s) 36. Device dies 34 may be logic device dies including logic transistors therein. In some exemplary embodiments, device dies 34 are designed for mobile applications, and may be Central Computing Unit (CPU) dies, Power Management Integrated Circuit (PMIC) dies, Transceiver (TRX) dies, or the like. Each of device dies 34 includes semiconductor substrate 35 (a silicon substrate, for example) that contacts adhesive layer 36, wherein the back surface of semiconductor substrate 35 is in contact with adhesive layer 36.

In some exemplary embodiments, metal pillars 40 (such as copper posts) are formed as the top portions of device dies 34, and are electrically coupled to the devices such as transistors (not shown) in device dies 34. In some embodiments, dielectric layer 38 is formed at the top surface of the respective device die 34, with metal pillars 40 having at least lower portions in dielectric layer 38. The top surfaces of metal pillars 40 may also be level with the top surfaces of metal pillars 40 in some embodiments. Alternatively, dielectric layers 38 are not formed, and metal pillars 40 protrude above a top dielectric layer of the respective device dies 34.

Figure 8:
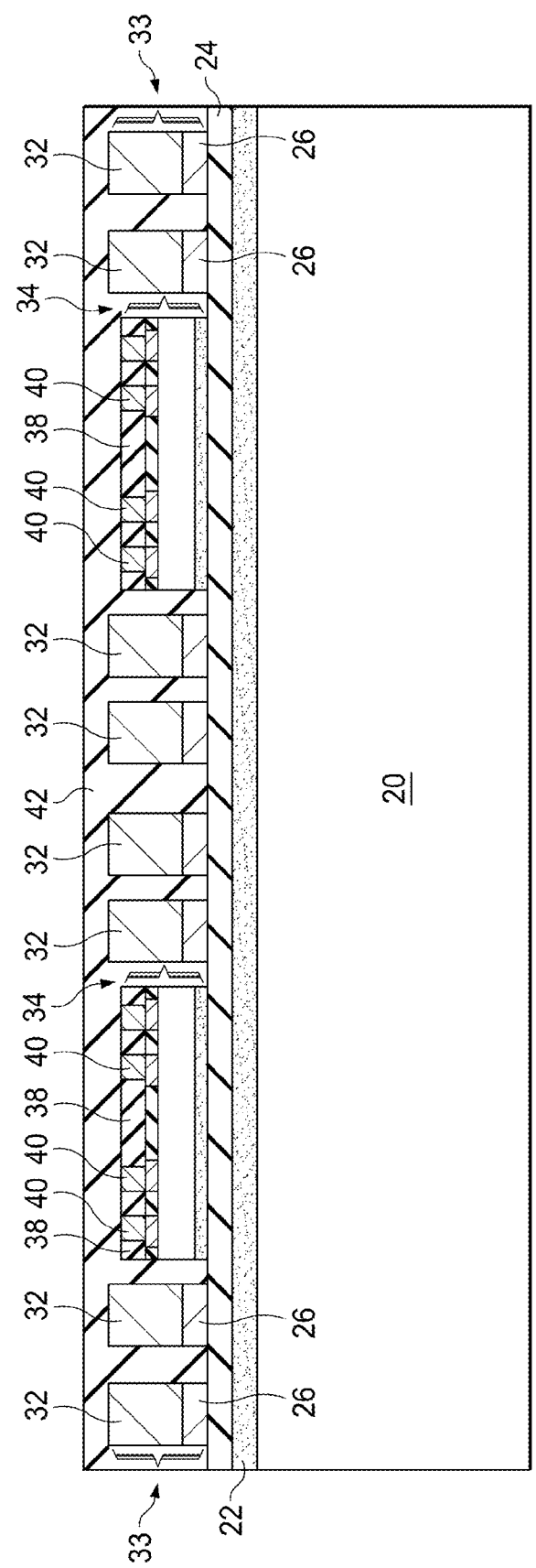

Referring to FIG. 8, molding material 42 is molded on device dies 34 and TIVs 33. Molding material 42 fills the gaps between device dies 34 and TIVs 33, and may be in contact with buffer layer 24. Furthermore, molding material 42 is filled into the gaps between metal pillars 40 when metal pillars 40 are protruding metal pillars. Molding material 42 may include a molding compound, a molding underfill, an epoxy, or a resin. The top surface of molding material 42 is higher than the top ends of metal pillars 40 and TIVs 33.

Figure 9:
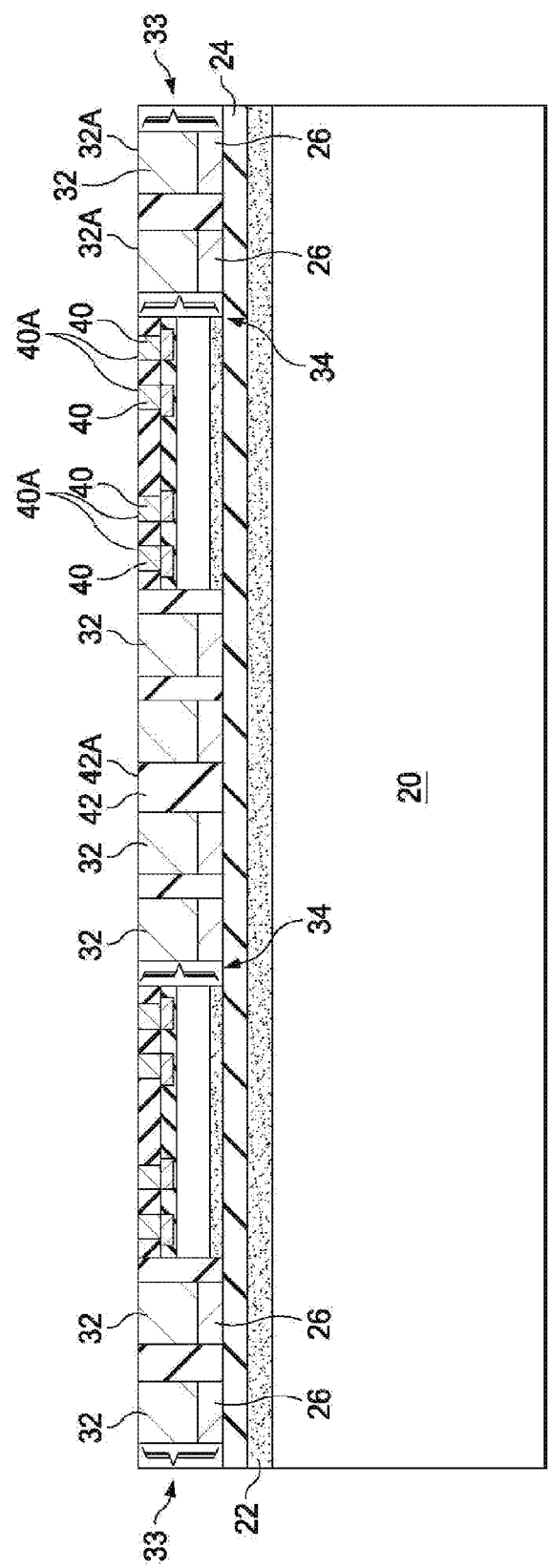

Next, a grinding step is performed to thin molding material 42, until metal pillars 40 and TIVs 33 are exposed. The resulting structure is shown in FIG. 9. Due to the grinding, the top ends 32A of metal features 32 are substantially level (coplanar) with the top ends 40A of metal pillars 40, and are substantially level (coplanar) with top surface 42A of molding material 42. As a result of the grinding, metal residues such as metal particles may be generated, and left on the top surfaces 32A, 40A, and 42A. Accordingly, after the grinding, a cleaning may be performed, for example, through a wet etching, so that the metal residue is removed.

Figure 10:
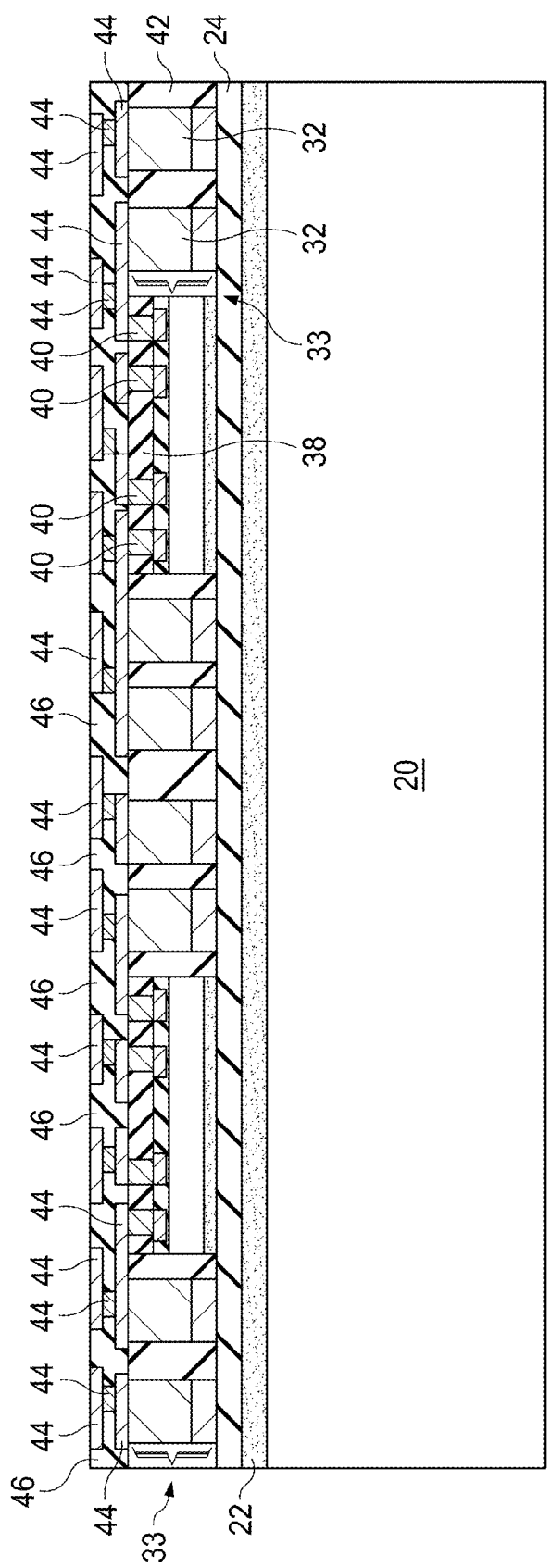

Next, referring to FIG. 10, Redistribution Lines (RDLs) 44 are formed over molding material 42 to connect to metal pillars 40 and TIVs 33. RDLs 44 may also interconnect metal pillars 40 and TIVs 33. In accordance with various embodiments, one or a plurality of dielectric layers 46 are formed over the structure shown in FIG. 9, with RDLs 44 formed in dielectric layers 46. In some embodiments, the formation of one layer of RDLs 44 and dielectric layers 46 includes forming a blanket copper seed layer, forming and patterning a mask layer over the blanket copper seed layer, performing a plating to form RDLs 44, removing the mask layer, and performing a flash etching to remove the portions of the blanket copper seed layer not covered by RDLs 44. In alternative embodiments, RDLs 44 are formed by depositing metal layers, patterning the metal layers, and fill the gaps between RDLs 44 with dielectric layers 46. RDLs 44 may comprise a metal or a metal alloy including aluminum, copper, tungsten, and/or alloys thereof. FIG. 10 illustrates two layers of RDLs 44, while there may be one or more than two layers of RDLs, depending on the routing requirement of the respective package. Dielectric layers 46 in these embodiments may comprise a polymer such as polyimide, benzocyclobutene (BCB), polybenzoxazole (PBO), or the like. Alternatively, dielectric layers 46 may include non-organic dielectric materials such as silicon oxide, silicon nitride, silicon carbide, silicon oxynitride, or the like.

Figure 11:
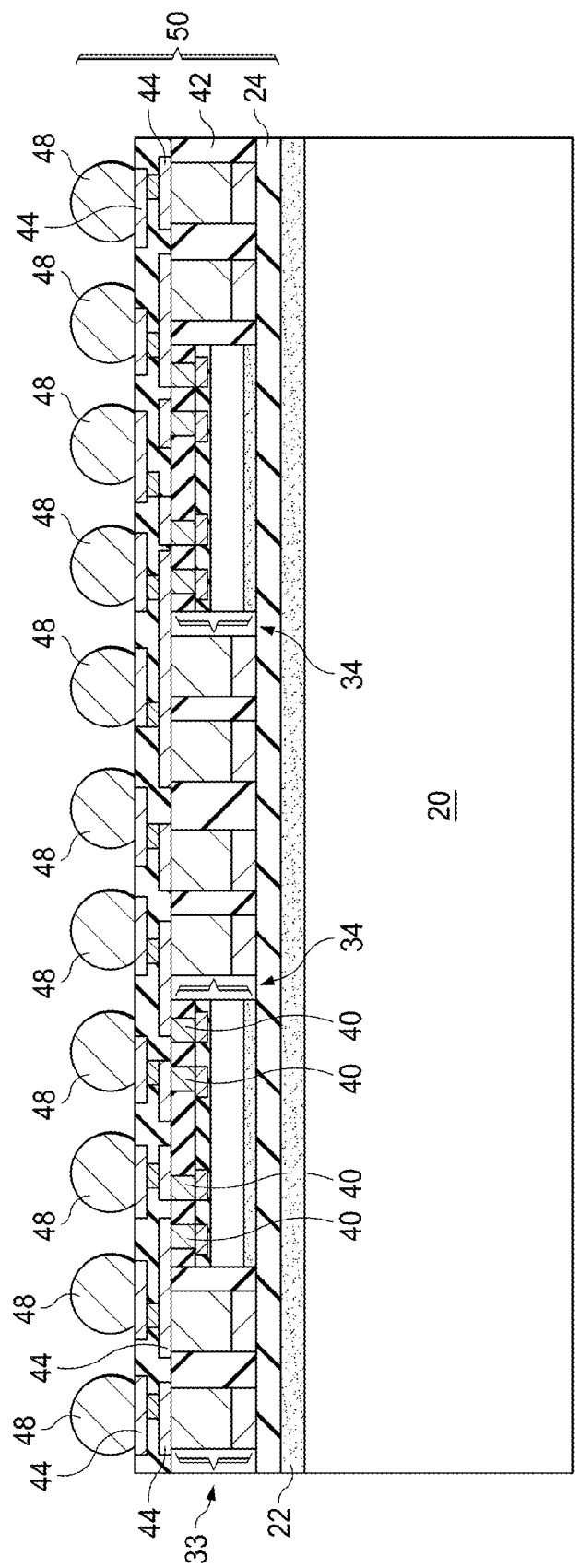

FIG. 11 illustrates the formation of electrical connectors 48 in accordance with some exemplary embodiments. The formation of electrical connectors 48 may include placing solder balls on the exposed portions of RDLs 44 (or Under-Bump Metallurgies (if formed, not shown)), and then reflowing the solder balls. In alternative embodiments, the formation of electrical connectors 48 includes performing a plating step to form solder regions over RDLs 44, and then reflowing the solder regions. Electrical connectors 48 may also include metal pillars, or metal pillars and solder caps, which may also be formed through plating. Throughout the description, the combined structure including device dies 34, TIVs 33, molding material 42, the overlying RDLs 44 and dielectric layers 46, and buffer layer 24 is referred to as TIV package 50, which may be a composite wafer.

Figure 12:
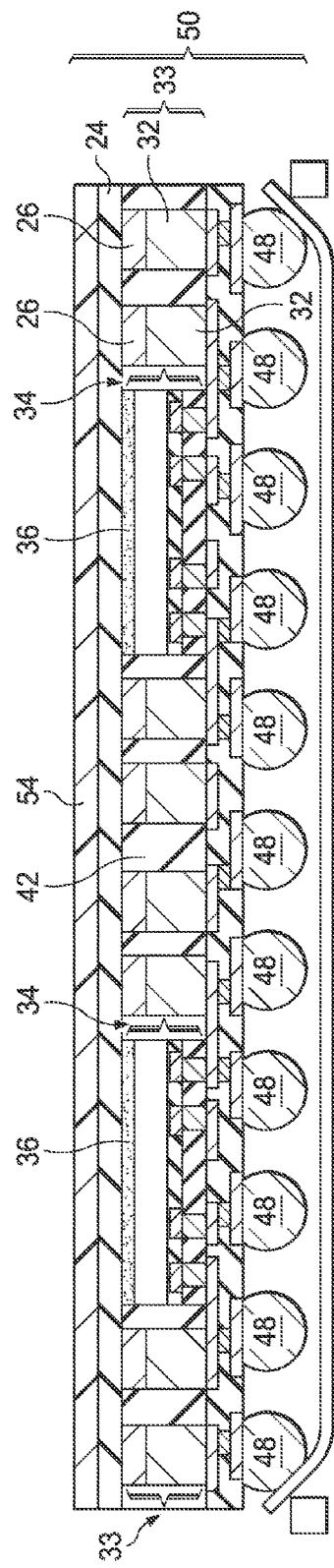

Next, TIV package 50 is de-bonded from carrier 20. Adhesive layer 22 is also cleaned from TIV package 50. The resulting structure is shown in FIG. 12. As a result of the removal of adhesive layer 22, buffer layer 24 is exposed. TIV package 50 is further adhered to a dicing tape 52, wherein electrical connectors 48 face toward, and may contact, dicing tape 52. In some embodiments, laminating film 54 is placed onto the exposed buffer layer 24, wherein laminating film 54 may comprises SR, ABF, backside coating tape, or the like. In alternative film, no laminating film 54 is placed over buffer layer 24.

Figure 13A:
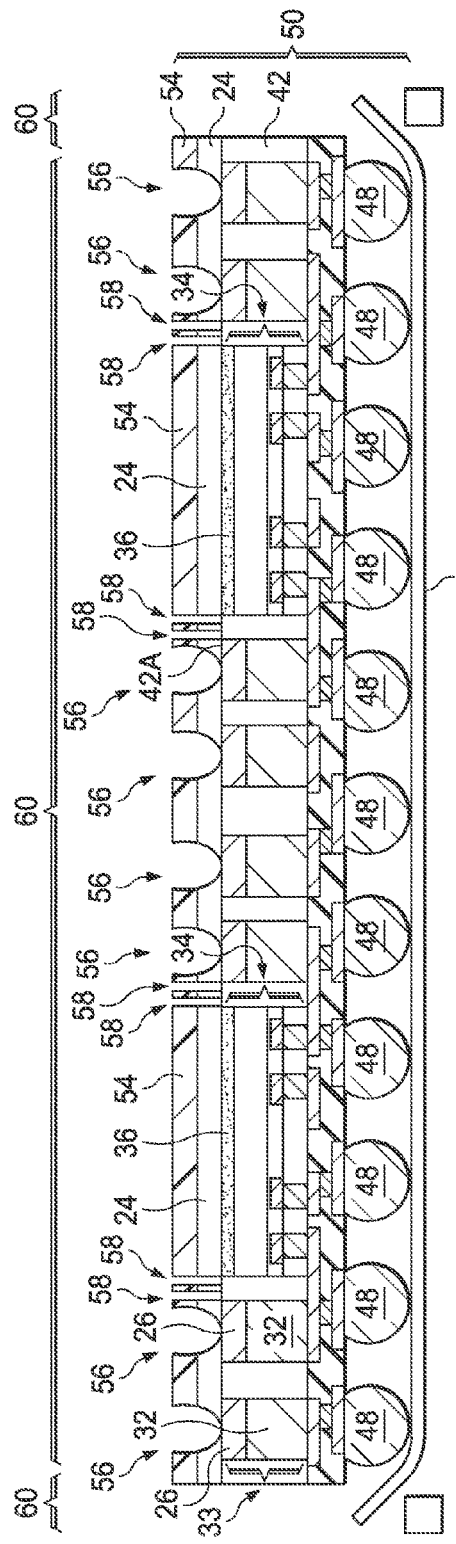

FIG. 13A illustrates the opening of buffer layer 24 and laminating film 54 (if any). Openings 56 and guiding trenches 58 are formed in buffer layer 24 and laminating film 54. In accordance with some embodiments, openings 56 and guiding trenches 58 are formed using laser drilling, although photolithography processes may also be used. TIVs 33 are exposed through openings 56. In the embodiments wherein seed layer 26 (FIG. 1) includes titanium portion 26A, an etch step is performed to remove titanium portion 26A, so that the copper portion 26B of seed layer 26 is exposed. Otherwise, if seed layer 26 does not include titanium, the etch step is skipped.

Figure 13B:
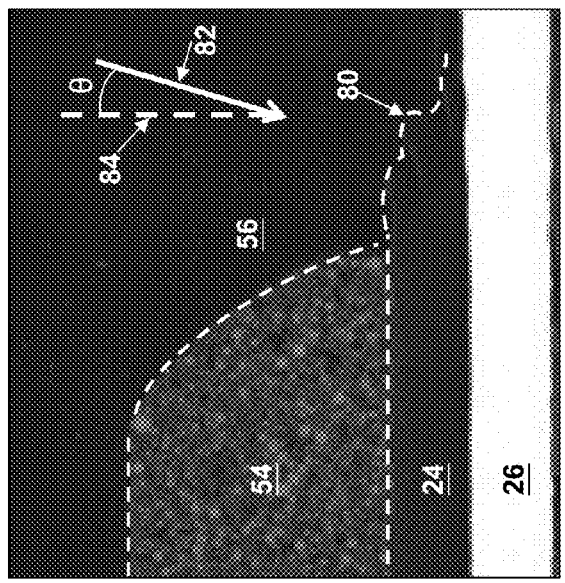
FIGS. 13B through 13D are views of an opening formed in a TIV package in accordance with some exemplary embodiments.
Figure 13D:
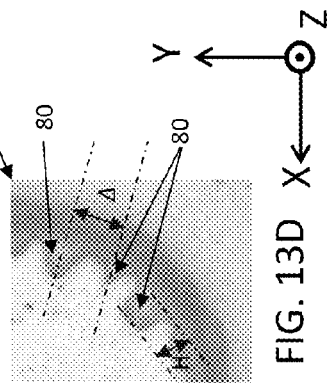
Figure 13C:
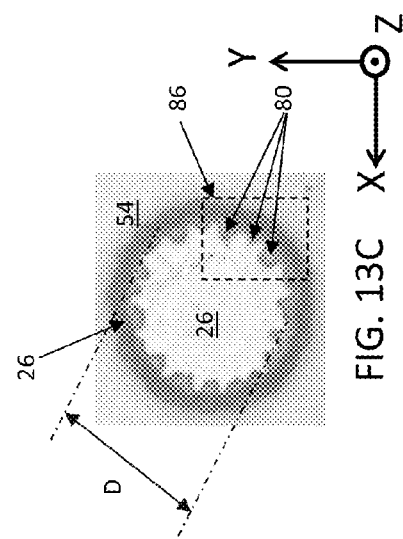

FIGS. 13B through 13D illustrate aspects of openings 56 when formed using laser drilling, and FIGS. 13E through 13J illustrate example openings 56 with varying sizes. FIG. 13B illustrates a cross-sectional view (e.g., in an X-Z plane corresponding to the cross-sectional view of FIG. 13A) of a portion of an opening 56 in the laminating film 54 and buffer layer 24. The buffer layer 24 can have a ripple 80 as a result of laser drilling 82 to form the opening 56. The laser drilling 82 (e.g., laser) can impinge upon the various layers at an angle of incidence θ to the normal 84 (e.g., in a Z direction as illustrated) of those layers. The ripple 80, as illustrated, is formed in the buffer layer 24, and in other embodiments, the ripple 80 may also be formed in the laminating film 54, if present. In the illustration, the ripple 80 in the buffer layer 24 projects towards the opening 56 away from a sidewall of the laminating film 54.

FIGS. 13C and 13D illustrate a layout view (e.g., in an X-Y plane) of an opening 56. FIG. 13D illustrates in further detail inset 86 in FIG. 13C. Ripples 80 in the buffer layer 24 are formed around a circumference of the opening 56. The ripples 80 can be in a periodic configuration around the circumference of the opening 56. The opening 56 can have a diameter D, which may the diameter of the portion of the seed layer 26 and/or TIV 33 exposed by the opening 56. The diameter D can be expressed in terms of instantaneous diameter, which may be from ripple 80 to opposing ripple 80, from valley to opposing valley, or valley to opposing ripple 80. An average diameter $D_{AVE}$ may be expressed as an average of the instantaneous diameters D across the opening 56. In some embodiments, the average diameter $D_{AVE}$ of the opening 56 can be from about 10 μm to about 600 μm.

Neighboring ripples 80 can have a peak-to-peak distance Δ. Further, ripples 80 can have a valley-to-peak height H. In some embodiments, the heights H of the ripples 80 can be from about 0.2 μm to about 20 μm. In some embodiments, the distance Δ can be from about 0.2 μm to about 20 μm. In some embodiments, the distance Δ can be expressed $$\Delta = \frac{\lambda}{1 + \|\sin\theta\|},$$

where λ is the wavelength of the radiation, e.g., laser, used in the laser drilling, and θ is the angle of incidence of the radiation used in the laser drilling (as illustrated in FIG. 13B). In some embodiments, the laser source for the laser drilling can be a UV source (which can have a wavelength of 355 nm), a green source (which can have a wavelength of 532 nm), a Nd:YAG source (which can have a wavelength of 1064 nm), a $CO_2$ source (which can have a wavelength of 9.4 μm), or the like. In the illustrated embodiment in FIGS. 13C and 13D, the height H is approximately 8 μm, and the distance Δ is approximately 10 μm.

Figure 13G:
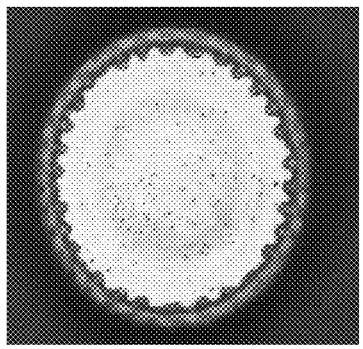
FIGS. 13E through 13J are layout views of openings having varying dimensions formed in a TIV package in accordance with some exemplary embodiments.
Figure 13J:
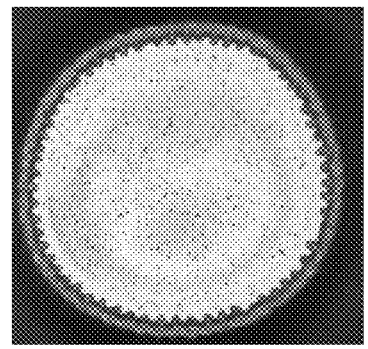
Figure 13F:
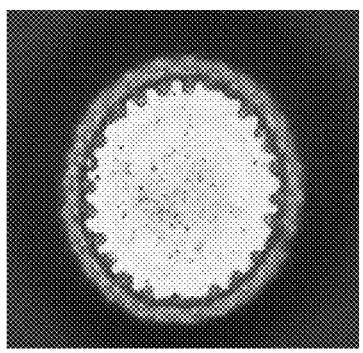
Figure 13I:
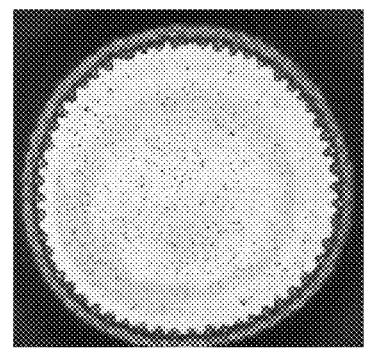
Figure 13E:
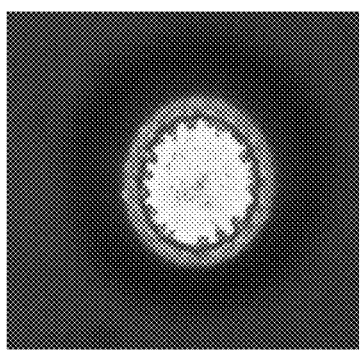
Figure 13H:
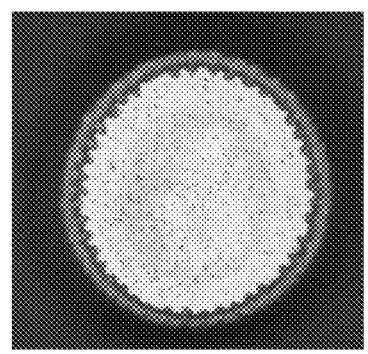

FIGS. 13E-13J illustrate layout views (e.g., in an X-Y plane) of openings 56 having differing average diameters $D_{AVE}$. The average diameter $D_{AVE}$ of the opening 56 in FIG. 13E is 80 μm. The average diameter $D_{AVE}$ of the opening 56 in FIG. 13F is 120 μm. The average diameter $D_{AVE}$ of the opening 56 in FIG. 13G is 152 μm. The average diameter $D_{AVE}$ of the opening 56 in FIG. 13H is 190 μm. The average diameter $D_{AVE}$ of the opening 56 in FIG. 13I is 220 μm. The average diameter $D_{AVE}$ of the opening 56 in FIG. 13J is 250 μm.

Figure 14A:
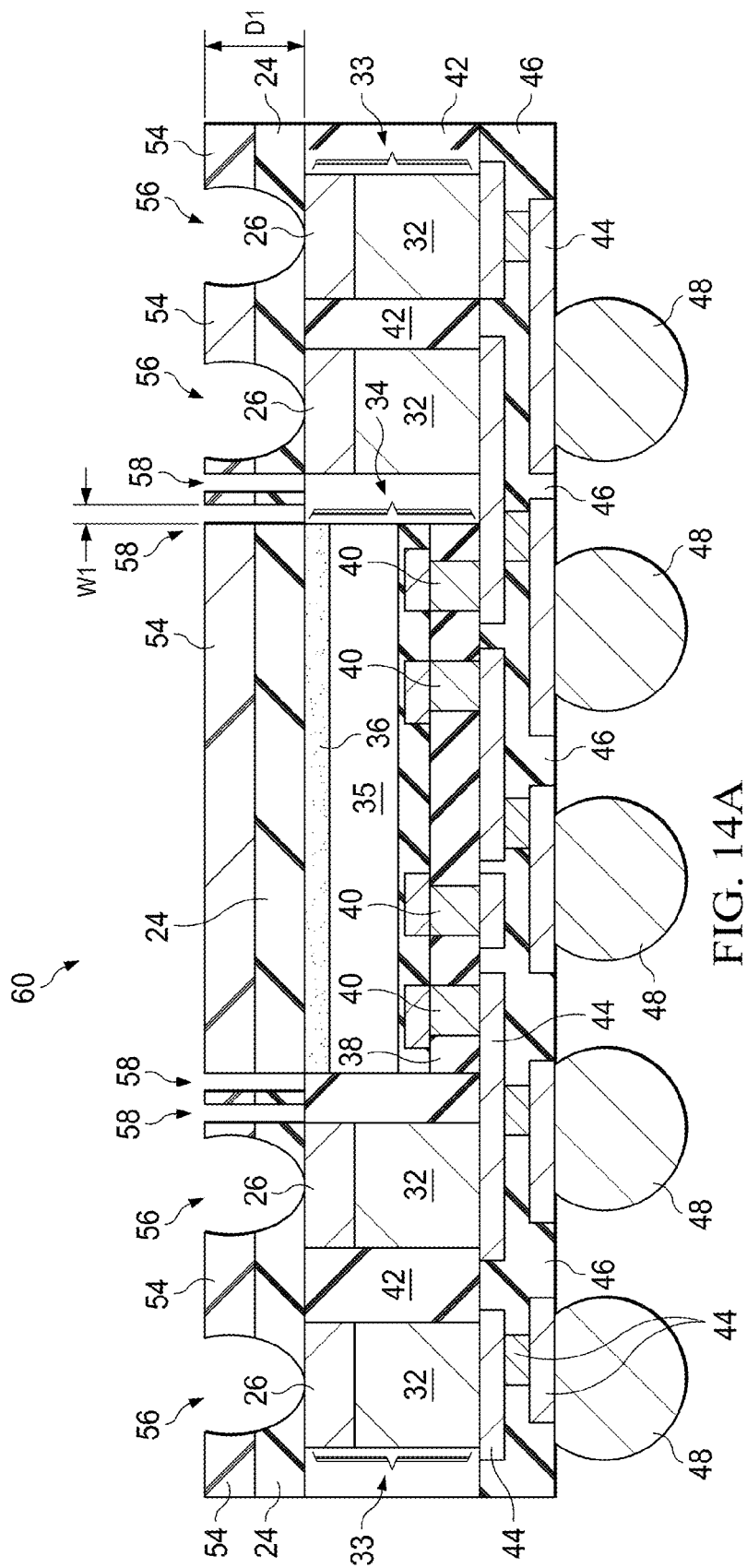
FIGS. 14A and 14B illustrate a cross-sectional view and a top view, respectively, of a TIV package in accordance with some exemplary embodiments.
Figure 14B:
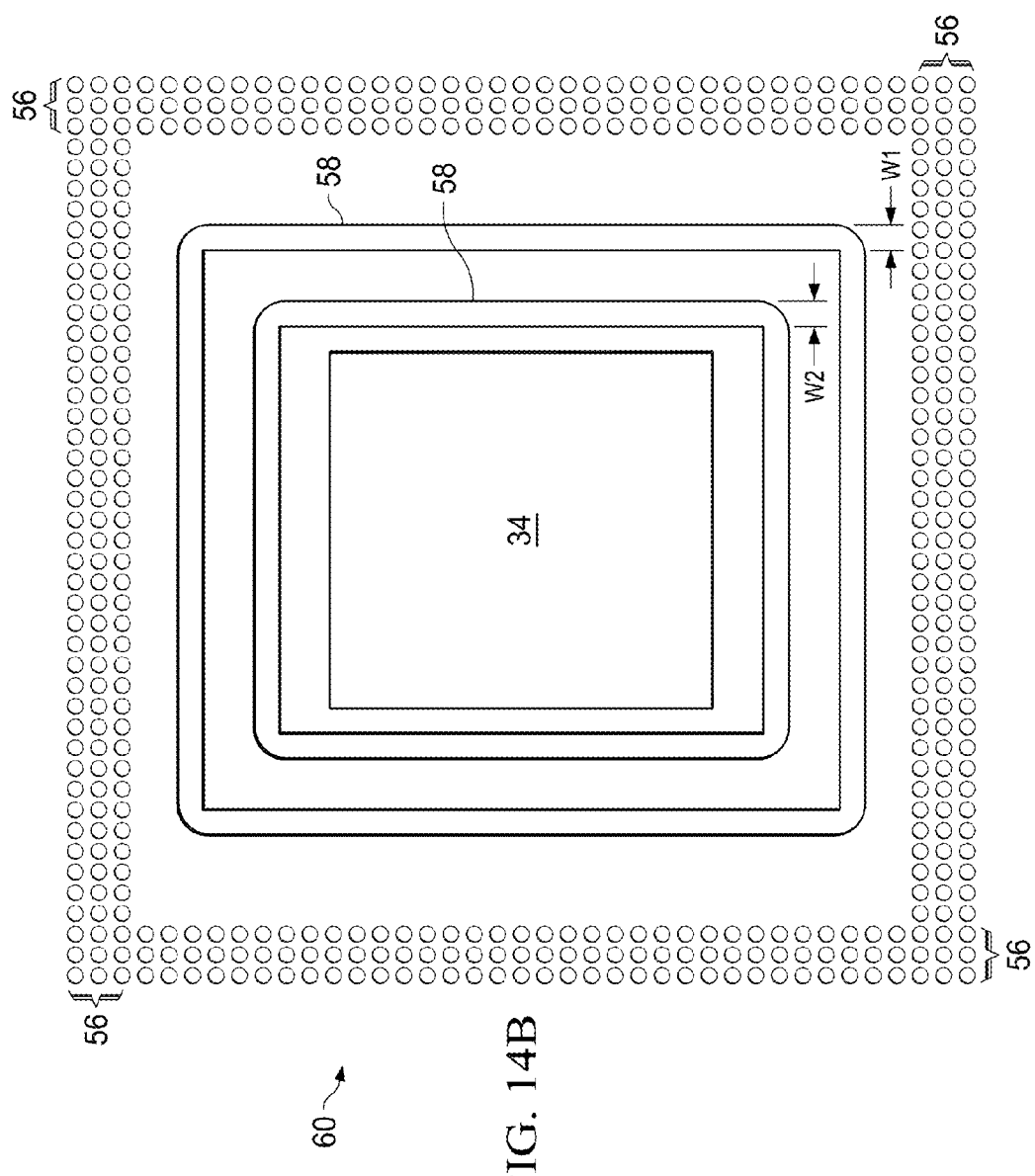

Referring back to FIG. 13A, guiding trenches 58 are also formed in buffer layer 24 and laminating film 54. In some embodiments, guiding trenches 58 are formed as rings, as illustrated in FIG. 14B. Accordingly, guiding trenches 58 are alternatively referred to as guiding trench rings 58, although they may also be formed as discrete guiding trench stripes or partial rings. As shown in FIG. 13, in some embodiments, each of guiding trenches 58 encircles a center portion of buffer layer 24 that overlaps the entire device die 34, with guiding trenches 58 misaligned with device die 34. Alternatively stated, guiding trenches 58 do not extend into the regions directly overlying device dies 34. The bottoms of guiding trenches 58 may be substantially level with the top surface 42A of molding material 42, and hence guiding trenches 58 penetrate through buffer layer 24 and laminating film 54. In alternative embodiments, guiding trenches 58 do not penetrate through buffer layer 24, and a lower part of buffer layer 24 remains underlying guiding trenches 58. In yet alternative embodiments, guiding trenches 58 penetrate through buffer layer 24, and extend into molding material 42.

Next, TIV package 50 is sawed into a plurality of TIV packages 60. FIGS. 14A and 14B illustrate a top view and a cross-sectional view, respectively, of one of TIV packages 60. In some embodiments, a solder paste (not shown) is applied to protect the exposed TIVs 33. In alternative embodiments, no solder paste is applied. As shown in FIG. 14B, in the top view, guiding trench rings 58 encircle device die 34. Although the inner edges of guiding trench rings 58 are shown as being off-set from the respective edges of device die 34, the inner edges of guiding trench rings 58 may also be aligned to the edges of the respective device die 34. In some embodiments, there is a single guiding trench ring 58 in each TIV package 60. In alternative embodiments, there are two or more guiding trench rings 58. The width W1 and W2 of guiding trench rings 58 may be greater than about 60 μm, and may be between about 60 μm and about 250 μm. The depth D1 (FIG. 14A) of guiding trench rings 58 may be greater than about 2 μm, and may be between about 2 μm and about 50 μm.

Figure 15:
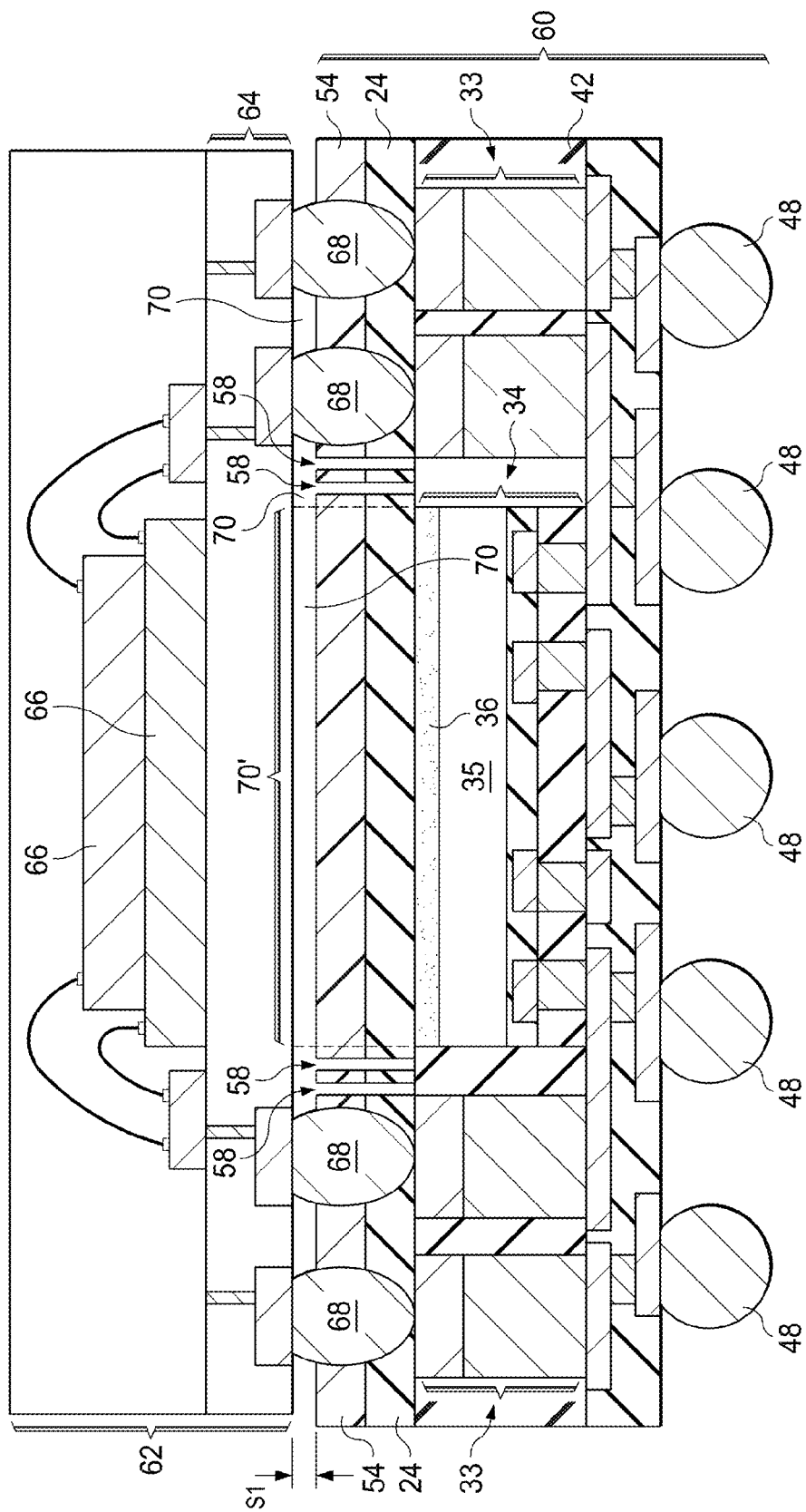
FIG. 15 illustrates the bonding of a TIV package with a top package.

FIG. 15 illustrates the bonding of top package 62 to TIV package 60, wherein the bonding may be through solder regions 68. Throughout the description, TIV packages 60 are also referred to as bottom package 60 since they may act as the bottom packages, as shown in FIG. 15. In some embodiments, top package 62 includes device dies 66 bonded to package substrate 64. Device dies 66 may include a memory die(s), which may be, for example, a Static Random Access Memory (SRAM) die, a Dynamic Random Access Memory (DRAM) die, or the like. The bottom surface of top package 62 and the top surface of TIV package 60 are spaced apart from each other by gap 70, wherein top package 62 and TIV package 60 may have standoff distance S1, which may be between about 10 μm and about 100 μm, although standoff distance S1 may have other values.

Figure 16:
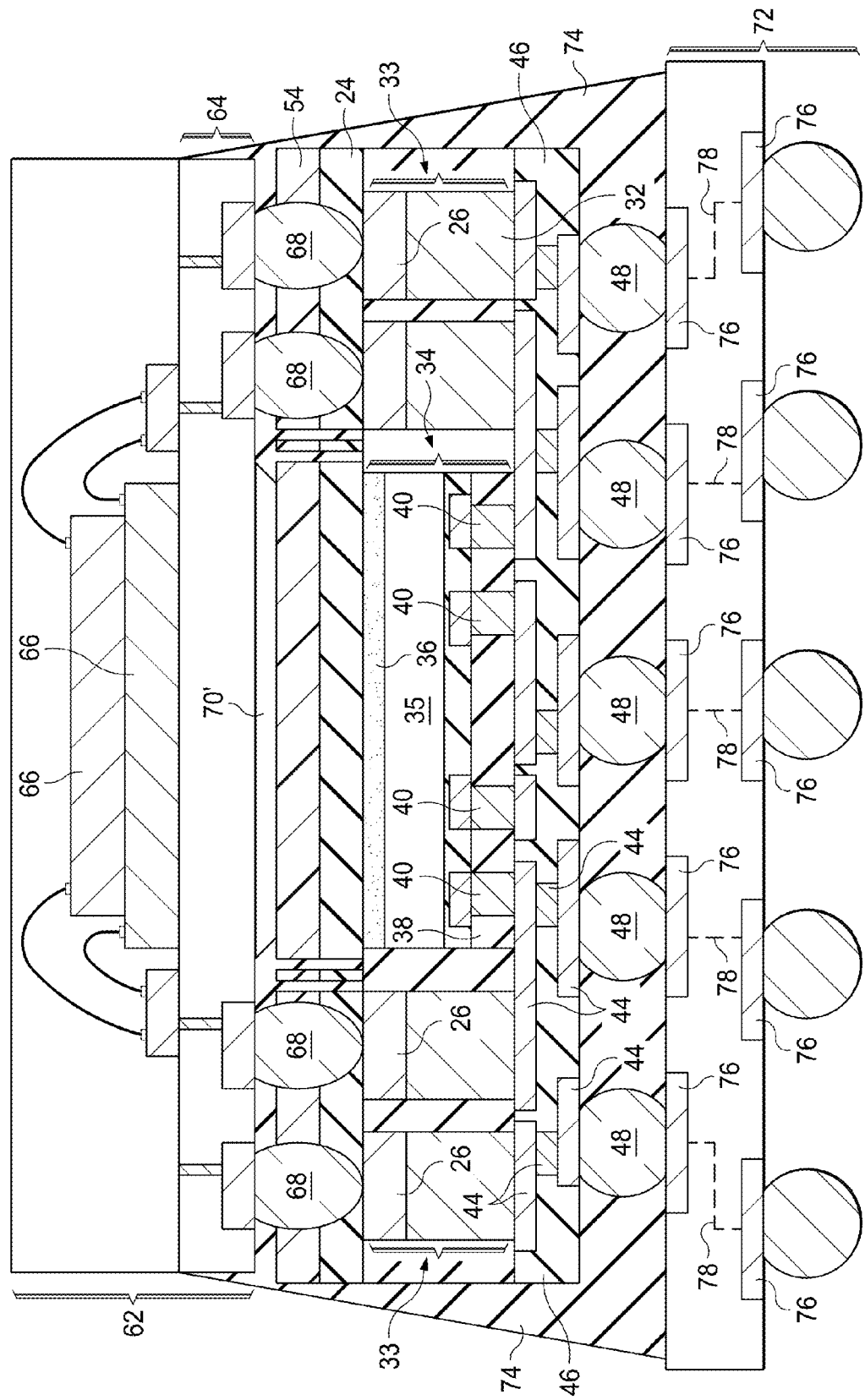
FIG. 16 illustrates the dispensing of underfill into a gap between the TIV package and a top package in accordance with some alternative exemplary embodiments.

Referring to FIG. 16, the bonded top package 62 and TIV package 60 are further bonded to another package component 72, which may be a package substrate in some embodiments. In alternative embodiments, package component 72 comprises a Printed Circuit Board (PCB). Package component 72 may have electrical connectors 76 (such as metal pads or metal pillars) on opposite sides, and metal traces 78 interconnecting the electrical connectors 76.

In some embodiments, underfill 74 is dispensed to fill gap 70 (FIG. 15). Underfill 74 may also seal the perimeter part of gap 70, while a center part 70' of gap 70 is not filled by underfill 74. In the dispensing of underfill 74, underfill 74 flows into gap 70 and guiding trenches 58 (FIG. 15). Since guiding trenches 58 are deeper than the center portion 70' of gap 70, underfill 74 will flow faster in guiding trenches 58 than in center gap portion 70'. Accordingly, underfill 74 will fill guiding trenches 58 first before it can flow into center portion 70', which overlaps device die 34. By ending the underfilling process at an appropriate time, underfill 74 is filled into guiding trenches 58, but does not enter center gap portion 70'. Underfill 74 thus may encircle, and does not fill into, the center gap portion 70'. Center gap portion 70' thus remains to be an empty space, which may be an air gap filled with air or a vacuumed empty space.

In the embodiments of the present disclosure, the TIV package and the overlying top package are separated from each other by an empty space, which may be an air gap or a vacuumed empty space or a vacuumed empty space. Since the heat-insulating ability of the empty space is better than that of underfill, the empty space has better ability for preventing the heat in the device die in the TIV package from being conducted to, and affecting the operation of, the dies in the top package. It is appreciated that if the guiding trenches are not formed, the distances that the underfill fills into the gap between the TIV package and the top package is random, and hence the formation of the empty spaces would have been non-uniform. Through the formation of the guiding trenches in the buffer layer, the formation of the empty space is more controllable, and is more uniform.

In accordance with some embodiments, a bottom package includes a molding compound, a buffer layer over and contacting the molding compound, and a through-via penetrating through the molding compound. A device die is molded in the molding compound. A guiding trench extends from a top surface of the buffer layer into the buffer layer, wherein the guiding trench is misaligned with the device die.

In accordance with other embodiments, a package includes a bottom package, and a top package bonded to the bottom package. The bottom package includes a molding compound having a planar top surface and a planar bottom surface, a device die molded in the molding compound, a planar dielectric layer over and contacting the planar top surface of the molding compound, a through-via penetrating through the molding compound, and a first guiding trench ring in the planar dielectric layer. The top package is spaced apart from the bottom package by a gap, wherein the first guiding trench ring is connected to the gap. An underfill fills a perimeter of the gap and at least a portion of the first guiding trench ring, wherein a center portion of the gap is encircled by the underfill, and wherein the center portion forms an empty space.

In accordance with yet other embodiments, a method includes forming a through-via over a dielectric buffer layer, placing a device die over the dielectric buffer layer, molding the device die and the through-via in a molding compound, and planarizing the molding compound to expose the through-via and a metal pillar of the device die. Redistribution lines are formed overlying and electrically coupled to the through-via and the metal pillar. Openings are formed in the dielectric buffer layer to expose the through-via. A guiding trench ring is formed in the dielectric buffer layer.

In accordance with further embodiments, a structure comprises a first package. The first package comprises a molding compound, a through-via penetrating through the molding compound, a device die molded in the molding compound, and a buffer layer on and contacting the molding compound. An opening is through the buffer layer to the through-via. The buffer layer has ripples in a plane parallel to an interface between the molding compound and the buffer layer and around a circumference of the opening.

In accordance with still further embodiments, a structure comprises a first package and a second package bonded to the first package. The first package comprises a molding compound comprising a planar top surface and a planar bottom surface, a device die laterally encapsulated by the molding compound, a through-via penetrating through the molding compound, and a planar dielectric layer over and contacting the planar top surface of the molding compound. An opening is through the planar dielectric layer to the through-via. Ripples are in the planar dielectric layer surrounding the opening. An external electrical connector electrically couples the first package to the second package, and the external electrical connector is disposed at least partially in the opening.

In accordance with even further embodiments, a method comprises forming a package. The forming the package comprises forming a composite structure. The composite structure comprises a device die, a molding compound, and a through-via. The molding compound at least laterally encapsulates the device die between a first surface of the molding compound and a second surface of the molding compound. The through-via is in the molding compound and extends from the first surface of the molding compound to the second surface of the molding compound. The forming the package further comprises forming a buffer layer on the first surface of the molding compound, and forming an opening through the buffer layer to the through-via using laser drilling. The buffer layer has ripples around the opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising: a first package comprising: a molding compound; a through-via penetrating through the molding compound; a device die molded in the molding compound; and a buffer layer on and contacting the molding compound, an opening being through the buffer layer to the through-via, the buffer layer having ripples in a plane parallel to an interface between the molding compound and the buffer layer and around a circumference of the opening, wherein a peak and a valley of the ripples are both disposed in the plane parallel to the interface between the molding compound and the buffer layer, and a guiding trench, wherein the guiding trench forms a ring, and wherein the guiding trench completely encircles a center portion of the buffer layer in a top-down view of the structure, with the center portion of the buffer layer overlapping an entirety of the device die.

2. The structure of claim 1, wherein the first package further comprises a laminating film on the buffer layer, the buffer layer being disposed between the laminating film and the molding compound, the opening being through the laminating film.

3. The structure of claim 1, wherein the ripples are in a periodic configuration around the circumference of the opening.

4. The structure of claim 1, wherein a peak-to-valley height of the ripples is inclusively between 0.2 μm and 20 μm.

5. The structure of claim 1, wherein a peak-to-peak distance between the ripples is inclusively between 0.2 μm and 20 μm.

6. The structure of claim 1, wherein an average diameter of the opening is inclusively between 10 μm and 600 μm.

7. The structure of claim 1 further comprising a second package bonded to the first package by an electrical connector through the opening.

8. The structure of claim 1, wherein the guiding trench extends from a surface of the buffer layer into the buffer layer, wherein the guiding trench is misaligned with the device die.

9. A structure comprising:
a first package comprising:
a molding compound comprising a planar top surface and a planar bottom surface;
a device die laterally encapsulated by the molding compound;
a through-via penetrating through the molding compound; and
a planar dielectric layer over and contacting the planar top surface of the molding compound, an opening being through the planar dielectric layer to the through-via, ripples being in the planar dielectric layer surrounding the opening, wherein an uppermost surface of the planar dielectric layer comprises a wavy shape around a circumference of the opening in a plan view of the structure;
a guiding trench is in the planar dielectric layer completely encircling a region of the planar dielectric layer corresponding to an area of the device die in the plan view of the structure; and
a second package bonded to the first package, an external electrical connector electrically coupling the first package to the second package, the external electrical connector being disposed at least partially in the opening.

10. The structure of claim 9, wherein the first package further comprises a laminating film on the planar dielectric layer, the planar dielectric layer being disposed between the laminating film and the molding compound, the opening being through the laminating film.

11. The structure of claim 9, wherein the ripples are in a periodic configuration surrounding the opening.

12. The structure of claim 9 further comprising an underfill disposed in a first space between the first package and the second package, wherein a portion of the underfill is disposed within the guiding trench, and wherein a second space between the first package and the second package is free of underfill.

13. A method comprising:
forming a package comprising:
forming a composite structure comprising a device die, a molding compound, and a through-via, the molding compound at least laterally encapsulating the device die between a first surface of the molding compound and a second surface of the molding compound, the through-via being in the molding compound and extending from the first surface of the molding compound to the second surface of the molding compound;
forming a buffer layer on the first surface of the molding compound, wherein the buffer layer comprises an insulating material; and
forming an opening through the buffer layer to the through-via using laser drilling, wherein the laser drilling forms ripples in the buffer layer around the opening.

14. The method of claim 13, wherein the forming the package further comprises forming a laminating film on the buffer layer, the forming the opening further comprising forming the opening through the laminating film using the laser drilling.

15. The method of claim 13, wherein the laser drilling comprises using a laser at an angle of incidence θ relative to a normal of an exposed surface of the buffer layer, the laser having a light wavelength λ, the ripples having a peak-to-peak distance Δ defined by $$\Delta = \frac{\lambda}{1 + \|\sin\theta\|}.$$

16. The method of claim 13, wherein the ripples are in a periodic configuration around the opening.

17. The method of claim 13, wherein a wavelength of a laser used in the laser drilling is selected from the group consisting of 355 nm, 532 nm, 1064 nm, 9.4 μm, and a combination thereof.

18. The method of claim 13, wherein the forming the package further comprises forming a guiding trench in the buffer layer.

* * * * *